(12) United States Patent
El Mel et al.

(10) Patent No.: US 12,247,279 B2
(45) Date of Patent: Mar. 11, 2025

(54) METHOD FOR PREPARING A CONDUCTIVE, TRANSPARENT AND FLEXIBLE MEMBRANE

(71) Applicants: Centre national de la recherche scientifique, Paris (FR); Nantes University, Nantes (FR)

(72) Inventors: Abdel-Aziz El Mel, Nantes (FR); Pierre-Yves Tessier, Nantes (FR); Adrien Chauvin, Pouance (FR)

(73) Assignees: Centre national de la recherche scientifique, Paris (FR); Nantes University, Nantes (FR)

( * ) Notice: Subject to any disclaimer, the term of this patent is extended or adjusted under 35 U.S.C. 154(b) by 0 days.

(21) Appl. No.: 17/669,850

(22) Filed: Feb. 11, 2022

(65) Prior Publication Data

US 2022/0162736 A1    May 26, 2022

Related U.S. Application Data

(63) Continuation of application No. 16/615,387, filed as application No. PCT/EP2018/063308 on May 22, 2018, now Pat. No. 11,279,998.

(30) Foreign Application Priority Data

May 24, 2017    (FR) ..................... 17 54647

(51) Int. Cl.
  *C23C 14/24*    (2006.01)
  *C23C 14/00*    (2006.01)
  (Continued)

(52) U.S. Cl.
  CPC ........ *C23C 14/0005* (2013.01); *C23C 14/165* (2013.01); *C23C 14/24* (2013.01);
  (Continued)

(58) Field of Classification Search
  CPC ........ H01B 1/02; H01B 13/0036; C22C 3/00; C22C 3/05; C23F 1/44; H01L 31/022466
  See application file for complete search history.

(56) References Cited

U.S. PATENT DOCUMENTS 4,977,038 A    12/1990  Sieradzki et al.
2004/0040416 A1  3/2004  Erlebacher et al.
(Continued)

FOREIGN PATENT DOCUMENTS

CN    104451547    * 3/2015
JP    2006-286515 A  10/2006
(Continued)

OTHER PUBLICATIONS

Okman et al, Journal of Alloys and Compounds 509(2011)6374-6381 (Year: 2011).*

(Continued)

*Primary Examiner* — Tabassom Tadayyon Eslami
(74) *Attorney, Agent, or Firm* — Knobbe, Martens, Olson & Bear, LLP (57) ABSTRACT

The technique relates to a method for preparing a nanomesh metal membrane 5 transferable on a very wide variety of supports of different types and shapes comprising at least one step of de-alloying 1 a thin layer 6 of a metal alloy deposited on a substrate 7, said method being characterized in that said thin layer 6 has a thickness less than 100 nm, and in that said de-alloying step 1 is carried out by exposing said thin layer 6 to an acid vapor in the gas phase 8, in order to form said nanomesh metal membrane 5.

8 Claims, 3 Drawing Sheets

(51) Int. Cl.

| | |
|---|---|
| *C23C 14/16* | (2006.01) |
| *C23C 14/35* | (2006.01) |
| *C23C 16/06* | (2006.01) |
| *C23F 1/12* | (2006.01) |
| *H01B 1/02* | (2006.01) |
| *H01B 13/00* | (2006.01) |
| *G06F 3/041* | (2006.01) |
| *G06F 3/047* | (2006.01) |
| *H01L 31/0224* | (2006.01) |
| *H01L 31/18* | (2006.01) |

(52) U.S. Cl.
CPC .............. *C23C 14/35* (2013.01); *C23C 16/06* (2013.01); *C23F 1/12* (2013.01); *H01B 1/02* (2013.01); *H01B 13/0036* (2013.01); *G06F 3/0412* (2013.01); *G06F 3/047* (2013.01); *G06F 2203/04112* (2013.01); *H01L 31/022491* (2013.01); *H01L 31/1888* (2013.01)

(56) References Cited

U.S. PATENT DOCUMENTS

| | | | |
|---|---|---|---|
| 2009/0079322 A1 | 3/2009 | Tsutsumi et al. | |
| 2013/0052475 A1* | 2/2013 | Kim | C22C 3/00 |
| | | | 428/606 |
| 2014/0268490 A1 | 9/2014 | Tsai et al. | |
| 2014/0377579 A1* | 12/2014 | Ren | H01B 1/02 |
| | | | 428/605 |
| 2016/0252785 A1 | 9/2016 | Kimura et al. | |

FOREIGN PATENT DOCUMENTS

| | | |
|---|---|---|
| WO | WO 2012/102714 A1 | 8/2012 |
| WO | WO 2012/102715 A1 | 8/2012 |

OTHER PUBLICATIONS

Chauvin, Adrien, et al., "Vapor dealloying of ultra-thin films: a promising concept for the fabrication of highly flexible transparent conductive metal nanomesh electrodes," NJP Flexible Electronics (2019) 3:5, (in 6 pages).

Hu, X. et al. 2010 "Electrochemiluminescence of CdTe quantum dots as labels at nanoporous gold leaf electrodes for ultrasensitive DNA analysis" *Talanta* 80: 1737-1743.

International Search Report in International Application No. PCT/EP2018/063308, dated Jul. 25, 2018.

Okman, O. et al. 2010 "Fabrication of crack-free nanoporous gold blanket thin films by petentiostatic dalloying" *Scripta Materialia* 63: 1005-1008.

Preliminary Search Report in corresponding French Application FR 1754647, dated Dec. 1, 2017.

Quan, X. et al. 2011 "Development of nanoporous gold electrodes for electrochemical applications" *Microelectronic Engineering* 88: 2379-2382.

* cited by examiner

METHOD FOR PREPARING A CONDUCTIVE, TRANSPARENT AND FLEXIBLE MEMBRANE

1. TECHNICAL FIELDS

The invention relates to the technical fields of transparent and conductive electrodes.

More specifically, the invention relates to a membrane composed of a perforated network of nanomesh metal domains capable of constituting such a transparent electrode, and a method for preparing such a membrane. The entire percolated network of nanomesh domains is designated by the term nanomesh membrane.

2. PRIOR ART

The market for transparent conductive electrodes is booming with growth driven mainly by touch tablets, smart phones, flat screens, sub-notebook, solar cells and organic light-emitting diodes. The global market for transparent electrodes is expected to be 5.1 billion US dollars in 2020. In terms of size, flexible displays, display segments are reputed to represent the largest market. Market trends are moving towards the development of large, robust, low-power systems. Flexibility and low manufacturing cost are therefore key factors in the method of manufacturing conductive electrodes.

It is known to introduce indium tin oxide (ITO) in thin layers into the composition of transparent conductive electrodes. However, ITO has three major disadvantages. In the first place, its availability is limited in time, given the rapid depletion of indium reserves worldwide. As a result, the relative cost of ITO is high compared to other materials and this can be a prohibitive disadvantage from the point of view of large-scale production. The second disadvantage of ITO is its lack of mechanical stability. The ITO layers are in fact fragile and can not be subjected to strong deformations without a significant degradation of their electrical properties. Their performance is therefore reduced in the field of supple and/or flexible electronics. Finally, the synthesis of ITO layers of satisfactory quality requires the use of methods implemented at high temperatures, which are incompatible with the polymer films used in flexible electronics.

Known ITO substitution technologies include thin films of zinc oxides doped with aluminum (ZnO:Al), silver nanowires, metal grids, carbon nanotubes, graphene, metal films, and the like, as well as nanoporous metal membranes. The ITO and ZnO:Al layers have the common disadvantage of poor resistance under deformation, and are therefore unsuitable for implementation on a flexible substrate. Silver nanowires are particularly complex to produce. In addition, their conductivity is degraded by the contact resistances existing between the nanowires due to the presence of polymer residues on the surface at the end of their production. Graphene and carbon nanotubes are also complex to produce and have reduced performance compared to ITO. In contrast, nanoporous metal membranes offer very high performance compared to ITO, especially in terms of electrical conductivity and flexibility.

Existing techniques for manufacturing metal membranes, including those described in U.S. Pat. No. 6,805,972B2, use four successive steps. A thin layer of a metal alloy is first deposited on a plane support. This thin layer is subsequently immersed in an acid solution in the liquid phase to be at least partially de-alloyed. "De-alloying" refers to the action by which at least one metal element of the thin layer is removed in order to form the nanoporous metal membrane. Thus, following a redox reaction, the least noble metal element of the alloy, i.e. the metal element having the lowest standard redox potential with an acid, is chemically etched on the substrate. Only the components of the thin layer forming the metal membrane remain. This membrane, in the case of deposition on a substrate having low adhesion with the deposit, and as a result of its immersion in the acid solution, dissociates itself from the substrate and rises to the surface of the acid solution. The membrane is subsequently removed from the surface of the acid solution by means of a graphite roller.

A disadvantage of such a technique for manufacturing metal membranes and which comprises a step of liquid phase de-alloying, is that it can only be implemented for thin metal alloy layers having a sufficient thickness to ensure good mechanical strength of the material in order to prevent agglomeration of the material during the liquid phase de-alloying.

Figure 1A:
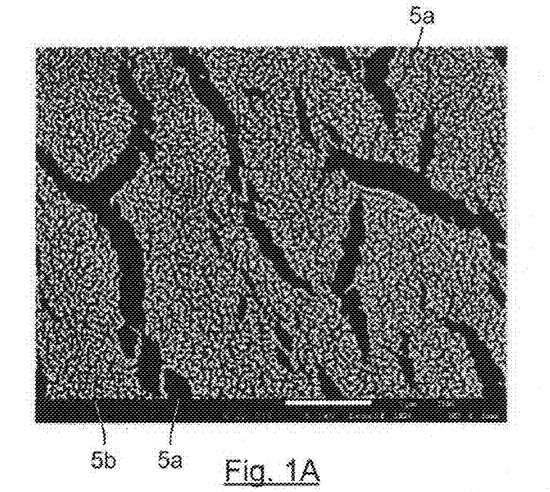
FIG. 1A shows a scanning electron microscopy (SEM) field image at a scale of 1 μm, of a nanomesh gold membrane obtained by de-alloying a layer of gold-copper alloy in nitric acid in the liquid phase, according to a method known from the prior art.
Figure 1B:
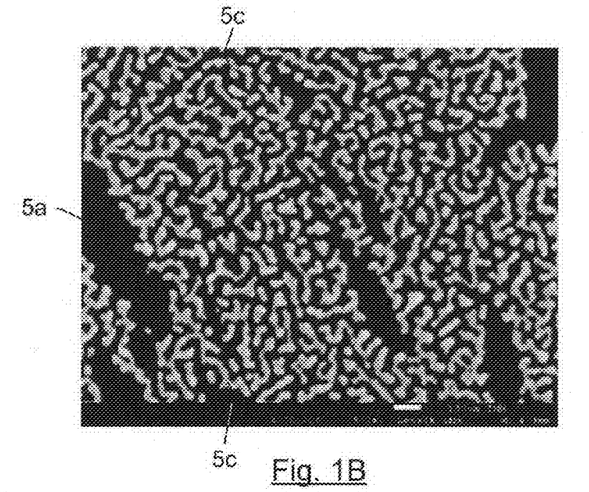
FIG. 1B shows an SEM field image, at a scale of 100 nm, of a nanomesh gold membrane obtained by de-alloying a layer of gold-copper alloy in liquid phase nitric acid according to a method known from the prior art.

Thus, it has been observed that for very small thicknesses, the membrane becomes particularly sensitive to the capillary and surface tension forces generated by the liquid during the de-alloying (see FIGS. 1A and 1B, and the comparative example described in point 5.2.1 of the present description).

In the rest of the description, the term "very small thickness" means a thickness less than 100 nm, preferably between 1 and 80 nm, preferably between 3 and 50 nm, preferably between 5 and 20 nm.

Thus, thin layers prepared by methods known from the prior art may either delaminate and degrade during their immersion in the acid, or survive the acid attack without detaching or agglomeration of the film in the acid solution, depending on the composition of these thin layers, their thickness and depending on their adhesion to the substrate.

In the first case, the membrane formed on the surface of the substrate disintegrates completely in the acid solution, thereby making it more difficult, if not impossible, to transfer it to an object to be coated.

In the second case, the method makes it possible to obtain a membrane consisting of a network of nanomesh metal domains, these domains each having a size of less than 10,000 square micrometers. Each nanomesh domain consists of interconnected metallic nanoligaments. The pore size of these nanomesh domains is nanometric. These nanomesh domains cover the surface of the substrate. All these nanomesh domains constitute the nanomesh membrane. However, such a membrane has the disadvantage of being electrically insulating as a result of the presence of microcracks separating the nanomesh domains from each other. Finally, the membrane may disintegrate and be destroyed during its detachment step and transfer to a substrate. A problem of nanoligament stability has also been revealed during the aging of the membranes. This problem is explained by a transformation of nanoligaments into nanobeads.

Such a manufacturing technique therefore does not make it possible to obtain membranes of very small thickness that are electrically conductive.

However, it has been observed that, in order to obtain a satisfactory transparency membrane in the visible spectrum, it was necessary, to reduce the thickness of the thin layer of the original alloy film to a value of 100 nm or less.

Such a manufacturing technique therefore does not make it possible to obtain conductive membranes having a satisfactory transparency.

Traditional techniques for manufacturing metal membranes are therefore unsuitable for the production of conductive metal membranes having a satisfactory transparency. There is therefore a need to provide a method of manufacturing a membrane that does not have the aforementioned drawbacks.

3. SUMMARY

The invention described below meets this need. More particularly, in at least one embodiment, the invention relates to a method for the preparation of a membrane composed of a network pierced with nanomesh metal domains comprising at least one step of de-alloying a thin layer of a metal alloy deposited on a substrate, said method being characterized in that said thin layer has a thickness of between 1 and 100 nm, and in that said de-alloying step is carried out by exposing said thin layer to an acid vapor resulting from the vaporization of an acid solution, in order to form the network of nanomesh metal domains. This step leads the nanomesh domains to be separated from their neighbors by an average distance of a few tens of microns.

The term "nanomesh metal domain" refers to a network of interconnected nanoscale metal ligaments. The pores of the nanomesh have sizes that vary between 10 and 100 nm. The term "de-alloying" refers here to the removal of at least one metallic element from the thin layer, in order to form the membrane with its network of nanomesh domains. The term "nanomesh membrane" refers to the entire network of nanomesh domains. The term "acid vapor" refers to the gaseous form emitted by an acid solution during its evaporation. Evaporation corresponds to the transition of the product from the liquid state to the gaseous state. The gaseous state is a state of matter in which the latter has no proper form or volume. A gas tends to occupy all the available volume. In contrast, the "liquid phase" refers to a state of matter in which the latter occupies a definitive volume, which depends only on the temperature as a result of the thermal expansion effect. The electrical resistance of the thin film is expressed as a sheet resistance, which is dimensionally equivalent to Ohm, but whose symbol is $\Omega$/square.

The nature of the substrate chosen to serve as a support for the thin layer of metal alloy at the base of the embodiment of the membrane may vary from one embodiment to another. This composition is chosen so that the metal elements intended to form the membrane have the least possible chemical affinity with the chosen substrate. This reduces the adhesion of the alloy to the substrate and consequently facilitates the subsequent detachment step of this membrane prior to the transfer step. In addition, the substrate must not disintegrate or react with the acid vapors or the solution used for detachment of the membrane.

Said substrate may be chosen preferably from the group of silicate and sodalime glasses.

According to Lewis' definition, an acid is a chemical compound that can, during a reaction, accept a pair of electrons. According to Brønsted's theory, an acid is a species that can release a proton. The choice of said acid is determined by the composition of the alloy that will be necessary for the de-alloying.

A method for the preparation of a membrane consisting of nanomesh metal domains according to the invention is based on a novel and inventive approach consisting of de-alloying a thin metal layer by exposing the latter to an acid vapor and not to a liquid consisting of an acid solution. The inventors have pointed out that under these conditions, the de-alloying takes place in a very low volume liquid phase. This is due to the condensation of the acid vapor which forms an ultrathin layer of concentrated acid on the surface of the thin metal layer. The de-alloying takes place in this ultrathin layer of acid to de-alloy the alloy while maintaining a very low surface tension. Consequently, the capillary adhesion of the acid-dealloyed thin layer is also reduced, which makes it possible to significantly limit the phenomenon of disintegration of the membrane during the de-alloying step. A method according to the invention thus allows the preparation of a membrane consisting of nanomesh metal domains having a thickness of between 1 and 100 nm, for a surface of macroscopic size.

In addition, the inventors have pointed out that, surprisingly, the de-alloying of the thin metal layer by an acid vapor leads to a specific nanostructuration of the metal membrane, with the formation of a network of nanomesh metal domains in the form of interconnected metallic nanoligaments, these nanomesh metal domains each having a size less than 10,000 square micrometers.

A membrane consisting of nanomesh metal domains prepared according to the invention has a particular morphology leading to excellent flexibility and particularly advantageous properties of transparency and electrical conductivity. The transparency in the visible spectrum can vary between 78% and 85%, for sheet resistances varying respectively between 44 and 1700 Ohm/square. The transparency can reach 78% in the visible spectrum, for an electrical resistance less than or equal to 44 Ohm/square.

According to a particular embodiment, said metal alloy comprises at least a first metal element, denoted A, intended to enter the composition of said membrane, and at least one second metal element, denoted B, intended to be etched chemically on said substrate. This is called a binary alloy. The standard redox potential of said first element A with an acid is greater than the standard redox potential of the second metal element B with an acid. The atomic concentration of said second metal element B in said metal thin layer is greater than a predetermined threshold below which the chemical etching of said second metal element on said substrate is reduced.

This predetermined concentration threshold of the less noble element B of the alloy is also referred to as "parting limit". By "least noble element" is meant the element having the lowest standard redox potential with an acid.

The oxidation-reduction potential, or redox potential, is an empirical quantity expressed in volts (symbol V) and denoted E° (Mn+/M) with (M) as any metal. This measurement is applied to redox pairs to predict the reactivity of the chemical species with each other. By convention, the standard potential E° is measured relative to the proton/hydrogen pair (H+/$H_2$), of zero potential.

Said first metal element may be chosen preferentially from the group consisting of gold, platinum, silver, zinc, nickel and copper. Said second metal element may be chosen preferentially from the group consisting of silver, copper and aluminum. Said first and second metal elements are different from each other.

Said metal alloy may be chosen preferentially from the group consisting of gold-silver, gold-copper, silver-aluminum, zinc-copper, platinum-copper, platinum-silver, nickel-aluminum and copper-aluminum alloys.

By way of example, in the context of a gold-copper alloy, copper is the least noble element of the alloy since the standard redox potential of copper in $Cu^{2+}$ ions, which at +0.34 V is lower than the standard redox potential of gold, which is +1.83 V. The difference between the potentials allows the selective dissolution of copper in the presence of acid. In this context, the "parting limit" is about 40 at. % of copper. It should be noted that the threshold value depends on the composition of the metal alloy while its determination is considered obvious to those skilled in the art, especially in view of their general knowledge.

Thus, this threshold value is approximately:

40 at. % of copper for the gold-copper alloy, 60 at. % silver for the gold-silver alloy.

According to a particular embodiment, said metal alloy comprises a plurality of first metal elements, at least two elements from a group denoted A' intended to enter the composition of said nanomesh metal membrane, and at least one third metal element. from a group denoted B', intended to be etched chemically on said substrate. When the metal alloy comprises two first metal elements of group A' and one element of group B', it is called ternary alloy.

The first metal elements of the group A' intended to enter the composition of said membrane may advantageously have the function of improving one or more physico-chemical characteristics of the metal membrane, for example by reinforcing the resistance of the membrane to the oxidation. The element of group B' is eliminated during the de-alloying operation. De-alloying therefore leads to the formation of a nanomesh membrane whose meshes are composed of an alloy of the first two metal elements of group A'. The necessary condition for the success of this de-alloying operation is that the oxidation potential of the element of group B' is smaller than that of the metal elements of group A'.

The first metal elements of group A' may be chosen preferentially from the group consisting of gold, platinum, silver, zinc, nickel and copper. The second metal element of group B' may be chosen preferentially from the group consisting of copper, aluminum, magnesium and silver. The first two metal elements of group A' and the metal element of group B' are different from each other. The standard redox potential of said first group A' elements with an acid is greater than the standard redox potential of the Group B' metal element with an acid.

Said alloy composed of three or more metal elements may be chosen preferentially from the group consisting of nickel-copper-magnesium, nickel-silver-magnesium, nickel-copper-aluminum and nickel-silver-aluminum ternary alloys.

According to a particular embodiment, said thin layer has a thickness less than 100 nm, preferably between 1 and 80 nm, preferably between 3 and 50 nm, preferably between 5 and 20 nm.

It has been observed that the optimum values of transparency and electrical conductivity of the membrane are achieved when the thickness of the initial thin layer is between 5 and 20 nm. It should also be noted that when the thickness of the membrane increases, the electrical conductivity also increases while its transparency decreases, and vice versa. A Haacke merit factor expresses the adaptation of the membrane for use as a transparent conductive coating and is known from the prior art. The choice of a more limited thickness range makes it possible to optimize this performance factor, and therefore to improve the adaptation of the membrane for use as a transparent conductive coating. A membrane consisting of nanomesh metal domains prepared according to the invention may advantageously have a Haacke merit factor of $2.13 \times 10^{-3} \Omega^{-1}$.

According to a particular embodiment, the preparation method comprises a step of detaching said nanomesh membrane from said substrate by dipping in a detaching solution.

The term "detaching solution" means a solution that has the least possible chemical affinity with the nanomesh membrane, so as to limit the risk of chemical reaction between the metal membrane and this solution.

Preferably, this detaching solution consists of deionized water.

A nanomesh metal membrane according to the invention can be easily peeled off the substrate in order to be recovered on any type of object surface to be coated. Following the detaching step, the nanomesh metal membrane floats on the surface of the detaching solution.

According to a particular embodiment, the preparation method comprises a subsequent step of transferring said nanomesh membrane to the surface of an object to be coated by immersing a surface portion of said object in said detaching solution.

During this step, the nanomesh membrane forms a continuous coating on all of this submerged surface portion of the object. It is in this step that the percolation of the nanomesh metal domains is effected to form a continuous membrane.

According to a particular embodiment, the preparation method comprises a step of depositing said thin metal layer on said substrate by cathodic sputtering or co-sputtering.

According to alternative embodiments, this deposition step is carried out by evaporation or co-evaporation (thermal or by electron gun), by chemical vapor deposition, by laser ablation or by any known method for synthesizing an alloy in the form of a thin layer.

Thus, the present invention makes it possible to obtain a membrane made up of nanomesh metal domains by implementing a method comprising the following steps:

a step of deposition on a substrate of a thin layer of a metal alloy, having a thickness of between 1 and 100 nm, by cathodic sputtering or co-sputtering;

a step of de-alloying said thin layer by exposure to an acid vapor, in order to form said nanomesh metal membrane;

a step of detaching said nanomesh membrane from said substrate by immersion in a detaching solution;

a subsequent step of transferring said nanomesh membrane to an object by immersing a surface portion of said object in said detaching solution.

Such a deposition method has the advantage of allowing the formation of a metal thin layer whose concentration is chosen with precision. It is therefore particularly suitable for the preparation of a thin layer for a subsequent de-alloying step.

The invention also relates to a nanomesh metal membrane obtained by a preparation method such as that described above.

The invention also relates to a nanomesh metal membrane that can be obtained by the preparation method such as that described above, characterized in that its thickness is between 1 and 100 nm.

As discussed above, such a nanomesh metal membrane has excellent flexibility and particularly advantageous properties of transparency and electrical conductivity.

The transparency can reach 78% in the visible spectrum, with an electrical resistance less than or equal to 44 Ohms/square.

The invention also relates to the use of such a nanomesh metal membrane as a coating for electrical conduction.

The invention also relates to the use of such a nanomesh metal membrane as a flexible and extensible conductive coating that can undergo deformation while keeping its conductive and transparent properties. For example, such a membrane can be used as an electrical conduction coating for the of surface of a flexible touch screen. The use of such a membrane for coating a nitrile or latex laboratory glove can be used to detect the occurrence of a tear, wherein the latter causes an increase in electrical resistance of the membrane.

4. FIGURES

The features and advantages of the invention will become apparent upon reading the following description of a particular embodiment, given by way of illustrative and non-limiting example, and through the appended figures, wherein.

The various elements illustrated in the figures are not necessarily represented on a real scale, the emphasis being more on the representation of the general operation of the invention.

5. DETAILED DESCRIPTION OF A PARTICULAR EMBODIMENT OF THE INVENTION

The general concept of a method for preparing a nanomesh metal membrane according to one embodiment of the invention is to implement a step of de-alloying an initial thin layer of a metal alloy in which the latter is exposed to an acid vapor, and not to a liquid consisting of an acid solution. A particular embodiment of the invention is presented in the following description. It is to be understood that the present invention is not limited by this particular embodiment and that other embodiments may be implemented without problem.

5.1 Method for Preparing a Nanomesh Metal Membrane

Figure 2:
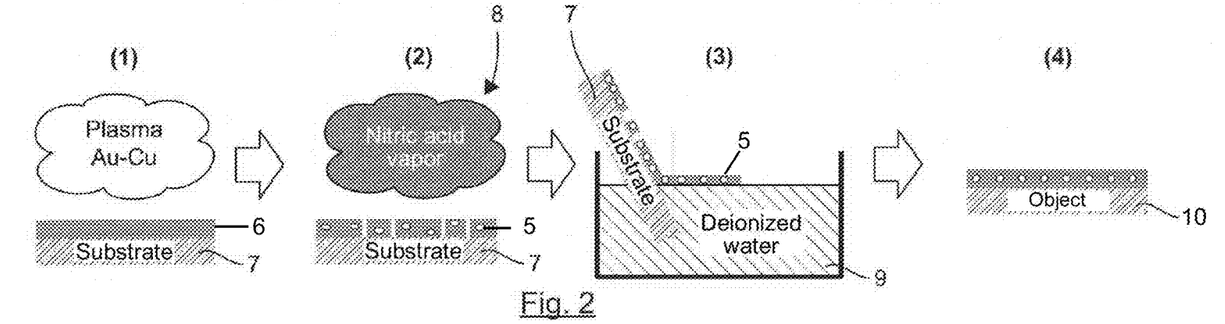
FIG. 2 shows schematically the successive steps of a method for preparing a nanomesh metal membrane according to one particular embodiment of the invention.

As shown in FIG. 2, a method for manufacturing a nanomesh metal membrane (5) comprises, according to a particular embodiment of the invention, a first step 1 of depositing a thin layer (6) on a substrate (7), followed by a second de-alloying step 2 of this thin layer (6) by exposure to an acid vapor (8), which makes it possible to obtain the membrane (5), followed by a third detaching step 3 of this membrane (5) of the substrate (7) by immersion in a dedicated solution (9), and a final transfer step of this membrane (5) on the surface of an object to be coated (10).

During the deposition step 1, a thin layer (6) made of a gold-copper (Au—Cu) binary alloy is deposited on a glass substrate (7). Within this metal alloy, and as detailed in the following description, the gold is intended to enter the composition of the future membrane (5) while the copper is to be etched chemically on the substrate (7) during a subsequent de-alloying step 2 of the thin layer (6).

According to alternative embodiments, any combination of metal elements can be used to form the thin layer (6), provided that the difference between the standard redox potentials of the latter is sufficiently high to allow their de-alloying. Thus, in a known manner, in the case of a metal alloy comprising at least a first metal element intended to enter the composition of said membrane (5), and at least a second metal element to be etched on the substrate (7) after exposure to an acid vapor (8), it is desirable for the first metal element to have an electrochemical oxidation potential $E°1$ with the acid (8) greater than the electrochemical oxidation potential $E°2$ of the second metal element with this same acid (8).

However, the de-alloying method is not limited only to the differences existing between the respective redox potentials of the different elements constituting the alloy.

Of course, these differences in redox potentials are a point to consider when working with noble metals such as gold and platinum (Pt). For example, to make nanoporous gold or a nanomesh gold membrane, the most commonly used binary alloys are gold-copper and gold-silver alloys. The standard redox potential of solid silver in $Ag^+$ ion is +0.8 V, whereas that of solid copper in $Cu^{2+}$ ions is +0.34 V. The standard redox potential of gold is +1.83 V. The difference between the potentials allows the selective dissolution of copper or silver.

On the other hand, in order to achieve de-alloying based on metals other than gold or platinum, such as copper or silver for example, other parameters having an influence on the chemical de-alloying reaction must also be taken into account. For example, in the case of a silver-aluminum alloy, it is possible to etch aluminum in a solution of hydrochloric acid in order to obtain nanoporous silver or a nanomesh silver membrane (5). However, It is not only the difference of potentials which allows this selective dissolution but also the taking into account of the formation of a layer of silver chloride on the surface of the metal silver, this same layer protecting the silver from dissolution during the de-alloying.

Non-limiting examples of binary metal alloys that may be used include gold-silver, gold-copper, zinc-copper, platinum-copper, nickel-aluminum and copper-aluminum alloys.

According to an alternative embodiment, the metal alloy constituting the initial thin layer (6) can also be composed of three metal elements (then called ternary alloy) or more. In this case, a single element of the ternary alloy may be removed in order to obtain a binary alloy membrane.

The additional metal element, intended to penetrate with the first metal element in the composition of said membrane, may advantageously have the function of improving one or more physico-chemical characteristics of the metal membrane.

Thus, by way of nonlimiting example, the thin layer (6) may consist of a nickel-copper-magnesium ternary alloy, in which the magnesium is intended to be etched on the substrate while the copper and nickel are intended to enter the final composition of the metal membrane (5). The function of the nickel is to increase the resistance of the copper to oxidation.

Alternatively, several ternary alloys may be considered, such as nickel-silver-magnesium, nickel-copper-aluminum, or nickel-silver-aluminum alloys.

With respect to the thin layer made of a gold-copper binary alloy, the atomic concentration of copper is set at 40 at. %. This threshold of concentration of the least noble element of the alloy, called "parting limit", corresponds to the concentration value below which the dissolution of this less noble element is reduced. This is related to the formation of a passivation layer of the most noble element at the very beginning of the de-alloying method, because of its high concentration in the alloy. This passivation layer acts as a protective layer which prevents the penetration of the acid solution into the alloy and thus prevents the dissolution of the least noble element of volume of the alloy. In the context of the de-alloying method, it is preferable that the concentration of the least noble element should be greater than this "parting limit" threshold concentration. In the case of gold-copper, the threshold concentration of dissolution is 40% copper while in the case of Au—Ag this threshold is 60% silver, as discussed in the publication "Unusual Dealloying Effect in Gold/Copper Alloy Thin Films: The Role of Defects and Column Boundaries in the Formation of Nanoporous Gold, by El Mel, A.-A.; Boukli-Hacene, F.; Molina-Luna, L.; Bouts, N.; Chauvin, A.; Thiry, D.; Gautron, E.; Gautier, N.; Tessier, P. Y., ACS Appl. Mater. Interfaces 2015, 7, 2310-2321.

According to alternative embodiments, the thickness of the thin layer (6) can vary between 1 and 100 nm, wherein this leads to the production of metal membranes (5) having conductivity and transparency variations. In this context and as discussed in the following description, it has been observed that as the thickness of the membrane (5) increases, the electrical conductivity also increases while its transparency decreases, and vice versa.

The composition of the substrate (7) chosen to serve as a support for the thin layer of metal alloy (6) at the base of the embodiment of the membrane (5) may vary from one embodiment to another. This composition is chosen so that the metal elements intended to form the membrane (5) have the least possible chemical affinity with the chosen substrate (7). This reduces the adhesion of the alloy to the substrate and consequently facilitates the subsequent detaching step of this membrane (5). In addition, the substrate must not disintegrate or react with the acid vapors or the solution used for the separation (5). As a nonlimiting example, and as illustrated in FIG. 2, the use of a glass substrate makes it possible to fulfill these requirements in the case of nanomesh membranes prepared by vapor phase etching of a layer of gold-copper. In fact, the metal element(s) remaining after the de-alloying interact(s) very weakly with the substrate (7) and the membrane (5) detaches very easily. In addition, the glass does not react with the acid used in the method.

Conversely, in the context of the formation of a silver membrane by de-alloying a silver-aluminum layer in hydrochloric acid, the use of a glass substrate is inappropriate, given its strong reaction potential with this acid.

According to alternative embodiments, any type of substrate having a known low affinity with the thin layer in question can be used.

As shown in FIG. 2, the deposition of the thin layer (6) is implemented by magnetron co-sputtering. Such a technique has the advantage of allowing the formation of a thin layer whose concentration is precisely controlled. Its implementation is therefore particularly advantageous for the preparation of a thin layer 6 before de-alloying.

According to alternative embodiments, this deposition step (1) is carried out by cathodic sputtering of an alloy, evaporation or co-evaporation (thermal or by electron gun), by chemical vapor deposition, by laser ablation or via any known method for synthesizing an alloy in the form of a thin layer.

During the de-alloying step (2), the gold-copper thin film (6) is de-alloyed by exposure to a nitric acid vapor (8). For this purpose, the nitric acid (8) selectively oxidizes and etches the metal element having the lowest oxidation potential with the nitric acid, in this case: copper. The elimination by etching of the less noble metal and the reorganization of the noblest metal lead to the formation of nanomesh metal domains (5b) consisting of interconnected metal nanoligaments (5c), wherein these domains (5b) cover the surface of the substrate (7) and each has a size smaller than 10,000 square micrometers. All these domains (5b) constitute the nanomesh membrane (5). By choosing the precursor alloy, one can define the metal forming the membrane (5), in this case: gold.

An essential point of the manufacturing method according to the invention lies in the fact that the nitric acid used for the de-alloying is in the form of vapor and not liquid. In fact, and as described in the description of the prior art, a direct immersion of the thin layer (6) in a nitric acid solution would cause its complete disintegration given the capillary forces generated at the interface between the thin layer and the acid solution. On the other hand, the exposure of the thin layer (6) to an acid vapor (8) makes it possible to significantly limit the phenomenon of disintegration of the latter. In fact, the inventors have observed that surprisingly, under these conditions, the de-alloying takes place in a very low volume liquid phase. This is due to the condensation of the acid vapor which forms an ultrathin layer of concentrated acid on the surface of the thin metal layer. The de-alloying takes place in this layer of ultrathin acid allowing the alloy to be de-alloyed while maintaining a very low surface tension. Consequently, the capillary adhesion of the dealloyed thin layer (6), i.e. the membrane (5), to the acid (8) is also reduced, which limits the stresses generated within the membrane (5), the appearance and/or the development of cracks, and the risk of detaching.

The de-alloying step (2) thus makes it possible, after de-alloying (2) of a thin gold-copper layer (6), to obtain a nanomesh gold metal membrane (5) having a thickness of less than 100 nm, for a macroscopic size surface.

Once the gold membrane (5) is formed on the surface of the glass substrate (7), the latter is immersed (3) in a deionized water solution (9) in order to detach the membrane (5) from the substrate (7). The deionized water (9) has the advantage of having a very low chemical affinity with gold. Such a choice thus makes it possible to limit the risks of solubilization of the membrane (5). Following the immersion of the substrate (7), the membrane (5), which is hydrophobic, is detached from the glass slide, which is hydrophilic. Following the immersion step (3), the nanomesh gold metal membrane (5) floats on the surface of the deionized water solution (9) without it disintegrating. For a layer of the prior art that would have been de-alloyed in the liquid phase without undergoing disintegration in the acid, it would disintegrate during immersion in water. The disintegration is thus not limited only to the de-alloying step (2), but it can also occur during the immersion step (3) in the detaching solution (9). The de-alloying step (2) via an acid vapor (8) makes it possible to avoid this disaggregation.

The composition of the detaching solution (9) can obviously vary from one embodiment to another, the latter being chosen so that the metal elements forming the membrane (5) have the least possible chemical affinity with the chosen solution (9).

In order to carry out the transfer (4) of the membrane (5) onto an object to be coated (10), a surface portion of this object (10) is immersed in the deionized water solution (9) on the surface of which the membrane (5) floats. During this transfer step (4), there is percolation of the nanomesh metal domains, which thus form a continuous nanomesh membrane (5) over the entire submerged surface portion of the object (10).

According to particular embodiments of the invention, this object to be coated may take the form of a solar cell, a flexible and extensible surface, a proton exchange membrane (PEM), a PET, polydimethylsiloxane (PDMS), silicon and/or glass, or any other support that can benefit from the advantageous properties of the membrane (5) in the context of a particular industrial application. Moreover, the surface of the object to be coated can be flat, adapted or left as is without the conductive and transparent properties being altered. For example, this surface (10) may be that of a cylinder, a cone, a sphere or an ellipsoid. The surface of the object to be coated may also have a more complex shape with a surface that may comprise both flat, non-planar, adapted and/or left as is portions. For example, it can be a bottle, a tube or a bottle, especially glass or polymer or any other type of material. For example, the membrane (5) can be transferred to the surface of a glass tube (i.e., non-planar surface): this surface remains transparent, and the conductivity of the object thus coated makes it possible to light an LED (photographs not shown).

According to one embodiment of the invention, the membrane (5) thus obtained is used as a coating for electrical conduction, for example on the surface of a touch screen, this screen being flexible.

According to an alternative embodiment, the membrane (5) may be used as a coating for detecting breaks in the surface of an object (10), the electrical resistance of the membrane varying as a function thereof. By way of example, the use of such a membrane for coating a laboratory glove made of nitrile or latex may make it possible to detect the occurrence of a tear.

5.2 Characterization of a Nanomesh Metal Membrane

In the remainder of the description, a nanomesh gold membrane (5) produced according to one embodiment of the invention has been subjected to SEM observations, optical transmittance tests and electrical resistance tests, and curvature tests.

5.2.1 Observations with a Scanning Electron Microscope

Figure 3A:
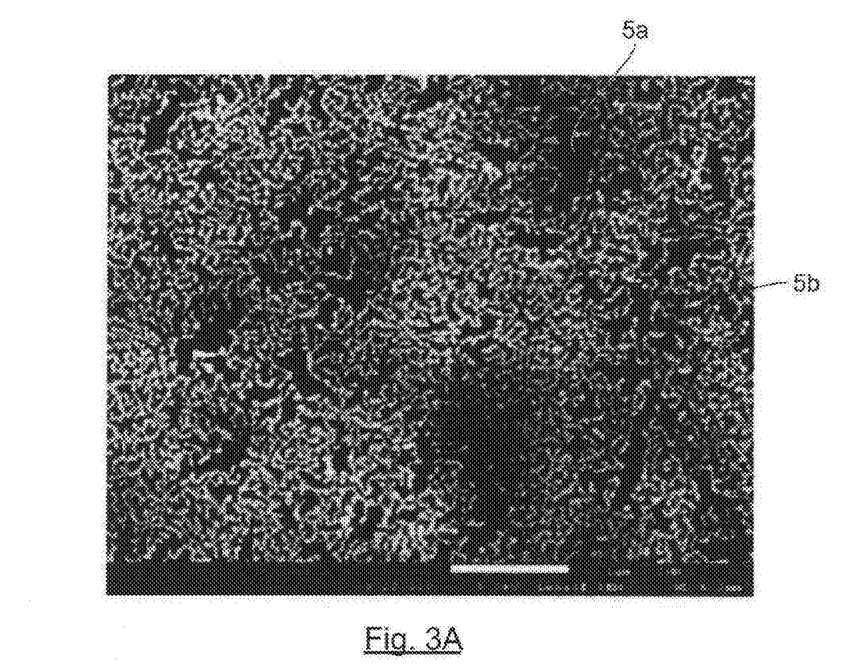
FIG. 3A shows an SEM image in the field, at a scale of 1 μm, of a nanomesh gold membrane according to one embodiment of the invention, after transfer onto a transparent and flexible support made of PET.
Figure 3B:
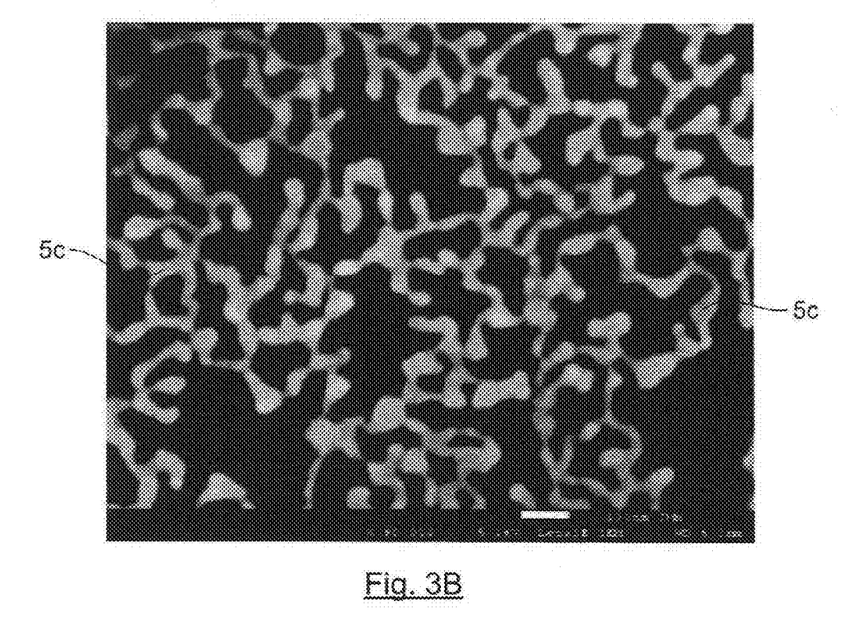
FIG. 3B shows an SEM field image, at a scale of 100 nm, of a nanomesh gold membrane according to one embodiment of the invention, after transfer onto a transparent and flexible support made of PET.

FIGS. 3A and 3B show images obtained by SEM field observation, at a scale of 1 μm and 100 nm respectively, of a nanomesh gold membrane obtained via a method according to an embodiment of the invention. More specifically, this membrane (5) was obtained from a thin layer (6) with a thickness of 10 nm, consisting of a gold-copper alloy composed of 24 at. % of gold. The thin film (6) was first deposited on a glass substrate by magnetron sputtering of a gold target and a copper target in the cofocal position. The thin layer was subsequently de-alloyed by exposure for 2 hours to nitric acid vapor (8), before being immersed in deionized water (9). Finally, the membrane obtained was transferred to a transparent and flexible PET support (10), for observation.

As a comparative example, a gold membrane obtained according to a known method from a thin layer having the same atomic composition and the same thickness as that described above was also observed through SEM. The major difference between these two methods lies in the fact that according to the invention, the de-alloying step is conducted in gaseous phase, and not liquid.

Thus, FIG. 1A shows an image obtained by scanning electron microscope (SEM) field image, at a scale of 1 μm, which illustrates the surface appearance of a gold membrane obtained by a known method. The PET substrate used in this experiment allows good adhesion of the membrane (5). The observation of this membrane (5) reveals the presence of microcracks (5a) between the nanomesh gold domains (5b). The cracks (5a) result from the stresses generated during the de-alloying method. The formation of these cracks (5a) and nanomesh domains (5b) is described in particular in the publications "In Situ Observation of Strain Development and Porosity Evolution in Nanoporous Gold Foils", by Dotzler, C. J. et al, Adv. Funct. Mater. 21, 3938-3946 (2011), and "Microstructure, stability and thermomechanical behavior of crack-free thin films of nanoporous gold", by Sun, Y., Kucera, K. P., Burger, S. A. & John Balk, Scr. Mater. 58, 1018-1021 (2008). By examining the domains (5b), it has been found that the latter are formed of nanoligaments (5c) physically disconnected from each other. This is the reason why the membranes are electrically insulating in this case. A problem of nanoligament stability relating to a transformation of nanoligaments into nanobeads has also been revealed during the aging of the membranes. The transformation of ligaments into beads is linked to the use of PET as a support to which the gold ligaments of strongly adhere, which is a factor limiting the relaxation of the mechanical stresses of the ligaments, generated during the de-alloying method.

Another reaction has been observed using glass substrates instead of PET or PDMS as the support (7). Depending on the gold content in the alloy and their thicknesses, the layers can detach and degrade during their immersion in the acid or survive the acid attack without detaching or agglomeration of the film in the acid solution. Although in the latter case, nanomesh domains are formed of nanoligaments, the membrane obtained is electrically insulating due to the presence of microcracks separating the nanomesh domains from each other. Finally, the membrane disintegrates during its immersion in the detaching solution and/or when it is transferred to a flexible substrate (e.g., PET).

In comparison with FIG. 1A, FIG. 3A shows the reduction of the cracks (5a) separating the nanomesh domains (5b) from each other and the percolation thereof. FIG. 5B makes it possible to highlight the bonds existing between the nanoligaments (5c) forming each of these nanomesh domains (5b). This interconnectivity of the metal nanoligaments (5c) gives the membrane (5) its ability to conduct electricity satisfactorily, as described below.

5.2.2 Optical Transmittance and Electrical Resistance Test Per Square

For this test, a nanomesh gold membrane was obtained from a thin layer (6) made of a gold-copper alloy having 17 at. % gold and 5 nm thickness in the initial state. Layer (6) was created by magnetron co-sputtering. The sample was then exposed to nitric acid vapor 8 for 30 minutes. The created membrane (5) was subsequently transferred to a PET carrier using deionized water (9).

For a comparison of the characteristics of the membrane studied with the known membranes, the transmittance at 550 nm as well as the resistance per square of the sample were measured.

The electrical resistance of the thin film is expressed as a resistance per square, which is dimensionally equivalent to Ohm, but whose symbol is $\Omega/\square$.

Figure 4:
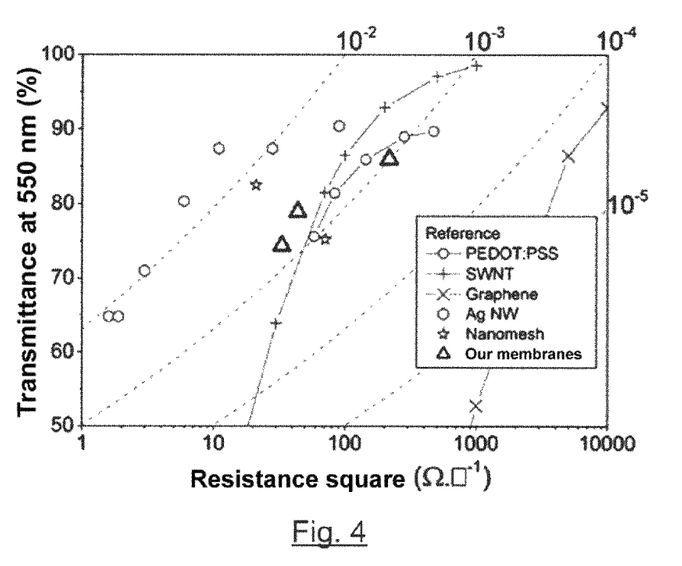
FIG. 4 shows a graph illustrating the variations in optical transmittance at a wavelength of 550 nm for different types of membranes or thin layers, as a function of their electrical resistance Ohms/square.

FIG. 4 shows a graph expressing transmittance values at 550 nm as a function of the resistance per square, in particular for membranes known from the prior art consisting of:
- a mixture of poly (3,4-ethylenedioxythiophene) and sodium polystyrene sulphonate, also known under the name PEDOT:PSS,
- carbon nanotubes,
- graphene,
- silver nanowires,
- nanomesh.

By way of comparison, the performance of 3 nanomesh gold membranes (denoted "Our membranes" made according to one embodiment of the invention are also shown in FIG. 4.

The properties of PEDOT:PSS are described in the publication "Highly Conductive PEDOT:PSS Electrode with Optimized Solvent and Thermal Post-Treatment for ITO-Free Organic Solar Cells", by Kim, Y. H. et al., Adv. Funct. Mater. 21, 1076-1081 (2011).

The respective properties of carbon nanotubes, graphene, silver nanowires, and nanomesh are described in the following publications:

"Past achievements and future challenges in the development of optically transparent electrodes", by Ellmer, K, Nat. Photonics 6, 809-817 (2012).

"A transparent electrode based on a nanotrough network metal", by Wu, H. et al., Nat. Nanotechnol. 8, 421-425 (2013).

"Silver Nanowire Networks as Flexible, Transparent, Conducting Films: Extremely High DC to Optical Conductivity Ratios", by De, S. et al, ACS Nano 3, 1767-1774 (2009).

As shown in FIG. 4, the membrane studied has a resistance of 44$\Omega/\square$ and an optical transmittance of 79%. The maximum optical transmittance values are 86% and the minimum square resistance values are 33$\Omega/\square$. These performances confer a factor of merit for this membrane (in English Haacke's factor of merit) of $2.13\times10^{-3}\Omega^{-1}$.

By way of comparison, the membrane studied possesses resistance and transmittance values comparable to those of carbon nanotubes deposited on PET. The resistance and transmittance values are also comparable to the performances obtained with silver nanowires or with PEDOT:PSS layers.

A nanomesh membrane (5) obtained according to the method described above thus has the advantage of having both transparency and a satisfactory electrical conductivity.

5.2.3 Curvature Resistance Tests—Deformation Resistance

Figure 5A:
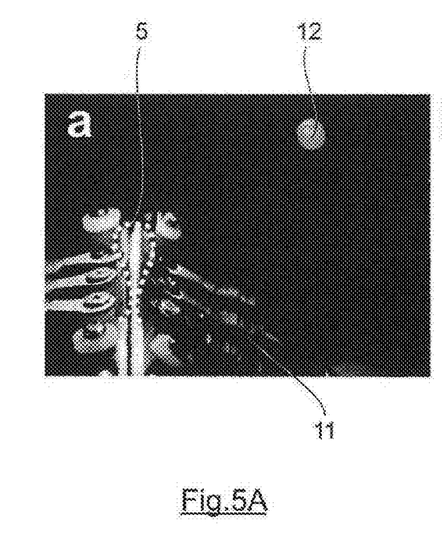
FIG. 5A shows a photograph showing the experimental device used for a fatigue resistance test of a nanomesh gold membrane according to one embodiment of the invention which undergoes curvature cycles.
Figure 5B:
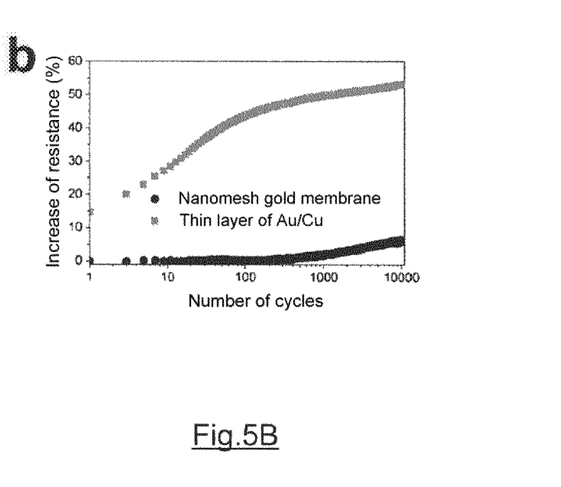
FIG. 5B shows a graph illustrating the respective electrical resistance variations of a nanomesh gold membrane according to one embodiment of the invention, and of a thin layer, as a function of the number of iterations of 1% of their deformation.

In the context of a first test, the experimental device that is represented in FIG. 5A, is a nanomesh gold membrane (5) deposited on a PET substrate, which has the same technical characteristics as the membrane tested with optical transmittance and electrical resistance as described above, was subjected to a bending force between two clamps (11). An LED (12) positioned in the background of FIG. 5A shows the passage or not of the electric current through the membrane (5).

During the test, it was observed that the membrane (5) undergoes a deformation of 2.5% and remains conductive (the LED (12) remains on, and confirms the passage of electric current in the membrane).

In the context of a second test, a gold membrane such as that described above and a thin layer having the same characteristics as the initial gold-copper alloy described above, have respectively undergone a deformation of 1% repeated 10,000 times.

FIG. 5B shows a graph illustrating the respective electrical resistance variations of the thin layer (6) before de-alloying and the resistance of the nanomesh membrane (5) after de-alloying of the thin layer (6), as a function of the number of iterations of their deformation.

Following the 10,000 deformation cycles, an increase in electrical resistance of less than 10% was observed in the case of the membrane (5) while the increase in electrical resistance of the thin layer (6) is more than 50%.

In comparison, a thin layer of indium tin oxide (ITO) known from the prior art sees its electrical resistance increase by 2000% after less than 100 deformation cycles, as described in the article "A nanotrough network", by Wu, H. et al., Nature nanotechnology 8, 421-425 (2013).

The curvature of a membrane (5) according to the invention is therefore significantly improved in comparison with known membranes of the prior art.

The invention claimed is:

1. A continuous nanomesh metal membrane, having a thickness between 1 and 20 nm, wherein the nanomesh metal membrane comprises an interconnected network of nanomesh metal domains, wherein each nanomesh metal domain has a size less than 10,000 square micrometers, wherein the nanomesh metal domains are interconnected by metallic nanoligaments and wherein the continuous nanomesh metal membrane has a first nanometric scale that defines interconnections within the nanomesh metal domains by nanoligaments and a second micrometric scale that defines interconnections between the nanomesh metal domains.

2. The continuous nanomesh metal membrane according to claim 1, wherein the nanomesh metal domains comprises pores have nanometric sizes varying between 10 and 100 nm and wherein interconnections between the nanomesh metal domains produce micro-scale pores between the nanomesh metal domains.

3. The continuous nanomesh metal membrane according to claim 1, wherein its transparency in the visible spectrum varies between 78% and 85%.

4. The continuous nanomesh metal membrane according to claim 1, wherein its sheet resistance varies between 44 and 1700 Ohm/square.

5. The continuous nanomesh metal membrane according to claim 1, comprising a first metal element chosen from the group consisting of gold, platinum, silver, zinc, nickel and copper or at least two elements chosen from the group consisting of gold, platinum, silver, zinc, nickel and copper.

6. The continuous nanomesh metal membrane according to claim 1, having a Haacke merit factor of $2.13\times10^{-3}\Omega^{-1}$.

7. A method of conducting electricity comprising coating an object with the continuous nanomesh metal membrane of claim 1, wherein the continuous nanomesh metal membrane is a transparent coating.

8. A method of detecting cracks or tears on a surface comprising coating the surface with the continuous nanomesh metal membrane of claim 1.

\* \* \* \* \*